(12) United States Patent
Lee et al.

(10) Patent No.: US 8,645,790 B2
(45) Date of Patent: Feb. 4, 2014

(54) DATA PROCESSING DEVICE AND METHOD USING ERROR DETECTION CODE, METHOD OF COMPENSATING FOR DATA SKEW, AND SEMICONDUCTOR DEVICE HAVING THE DATA PROCESSING DEVICE

(75) Inventors: Jin-il Lee, Hwaseong-si (KR); Dong-min Kim, Seoul (KR); Young-soo Sohn, Seoul (KR); Kwang-il Park, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 292 days.

(21) Appl. No.: 13/239,156

(22) Filed: Sep. 21, 2011

(65) Prior Publication Data

US 2012/0117443 A1    May 10, 2012

(30) Foreign Application Priority Data

Nov. 8, 2010 (KR) .......................... 10-2010-0110343

(51) Int. Cl.
*H03M 13/00* (2006.01)
(52) U.S. Cl.
USPC ............. 714/758; 714/775; 360/40; 710/301; 370/208
(58) Field of Classification Search
USPC ........... 714/758, 775; 370/208, 210; 710/301; 710/62; 360/40
See application file for complete search history.

(56) References Cited

U.S. PATENT DOCUMENTS

| 4,544,962 | A | * | 10/1985 | Kato et al. | 360/40 |
| 2004/0141458 | A1 | * | 7/2004 | Park et al. | 370/208 |
| 2008/0059679 | A1 | * | 3/2008 | Zhang et al. | 710/301 |
| 2009/0319877 | A1 | | 12/2009 | Bains et al. | |

FOREIGN PATENT DOCUMENTS

| JP | 2001-175490 | 6/2001 |
| KR | 1020070072229 | 7/2007 |

\* cited by examiner

*Primary Examiner* — Guy Lamarre
(74) *Attorney, Agent, or Firm* — F. Chau & Associates, LLC

(57) ABSTRACT

A data processing device for transmitting a first data includes a data generator configured to provide the first data, a cyclic redundancy check (CRC) generator configured to generate a CRC information having at least one bit whose binary value is modified in response to a toggle information, and a data transmitter configured to combine the CRC information and the first data as a combined data and output the combined data in serial. A data processing method for transmitting a first data includes a step of generating a first data, a step of generating cyclic redundancy check (CRC) information having at least one bit whose binary value is modified in response to a toggle information, and a step of generating a combined data by combining the generated CRC information and the first data as a combined data and outputting the combined data in serial.

17 Claims, 15 Drawing Sheets

DATA PROCESSING DEVICE AND METHOD USING ERROR DETECTION CODE, METHOD OF COMPENSATING FOR DATA SKEW, AND SEMICONDUCTOR DEVICE HAVING THE DATA PROCESSING DEVICE

CROSS-REFERENCE TO RELATED APPLICATIONS

This application claims the benefit of Korean Patent Application No. 10-2010-0110343, filed on Nov. 8, 2010, in the Korean Intellectual Property Office, the disclosure of which is incorporated by reference herein in its entirety.

1. Technical Field

The inventive concept relates to a data processing device and method, and more particularly, to a data processing device and method using an error detection code, a method of compensating for data skew, and a semiconductor device including the data processing device.

2. Discussion of Related Art

In high speed data communication among data processing devices, a large amount of data is communicated over transmission lines connected between the data processing devices. During such high speed data transmission, some data bits may be delayed and distorted for various reasons, causing skew and erroneous data reception. Therefore, a need exists for a high speed data communication error correction and de-skewing technology.

SUMMARY

In an embodiment of an inventive concept, a data processing device for transmitting a first data comprises a data generator configured to provide the first data, a cyclic redundancy check (CRC) generator configured to generate a CRC information having at least one bit whose binary value is modified in response to a toggle information, and a data transmitter configured to combine the CRC information and the first data as a combined data and output the combined data in serial.

In a further embodiment of the inventive concept, the toggle information determines the at least one bit in the CRC information to be determined. The at least one bit whose binary value is inverted in response to the toggle information.

In a further embodiment of the inventive concept, the data processing device further comprises a pattern checker configured to generate the toggle information when the first data has a predetermined binary value pattern. The predetermined binary value pattern has the same binary value.

In a further embodiment of the inventive concept, the data processing device further comprises a register configured to store the toggle information.

In a further embodiment of the inventive concept, the transmitter includes a parallel-to-serial converter configured to covert the combined data to a serial data. The serial data includes at least one low-to-high or high-to-low signal edge on the part of CRC information.

In a further embodiment of the inventive concept, the data generator is a semiconductor memory device.

In an embodiment of an inventive concept, a data processing method for transmitting a first data comprises a step of generating a first data, a step of generating cyclic redundancy check (CRC) information having at least one bit whose binary value is modified in response to a toggle information, and a step of generating a combined data by combining the generated CRC information and the first data as a combined data and outputting the combined data in serial.

In a further embodiment of the inventive concept, the data processing method further comprises a step of generating the toggle information when the first data has a predetermined binary value pattern. The predetermined binary value pattern has the same binary value.

In a further embodiment of the inventive concept, the data processing method further comprises a step of storing the toggle information.

In a further embodiment of the inventive concept, the data processing method further comprises a step of serializing the combined data as a serial data. The serial data includes at least one low-to-high or high-to-low signal edge on the part of CRC information.

In a further embodiment of the inventive concept, the step of generation a first data is performed on a semiconductor memory device.

In an embodiment of an inventive concept, a data processing device for receiving a first data comprises a data input buffer configured to receive a serial data having a CRC information and the first data, a clock recovery circuit configured to reconstruct a clock from the serial data, a sampling circuit configured to sample the serial data based on the clock, a converter circuit configured to parallelize and split the serial data into the CRC information and the first data, a CRC detector configured to modify the CRC information having at least one bit whose binary value is modified in response to a toggle information, and an error checker configured to determine whether the first data includes at least one error.

In a further embodiment of the inventive concept, the data processing device further comprises a pattern checker configured to generate the toggle information when the first data has a predetermined binary value pattern. The predetermined binary value pattern has the same value.

In a further embodiment of the inventive concept, the data processing device further comprises a register configured to store the toggle information. The serial data includes at least one low-to-high or high-to-low signal edge on the part of CRC information.

In an embodiment of an inventive concept, a data processing method for receiving a first data comprises a step of receiving a serial data having a CRC information and the first data, a step of reconstructing a clock from the serial data, a step of sampling the serial data based on the clock, a step of parallelizing the serial data, a step of splitting the serial data into a CRC information and the first data, a step of modifying the CRC information in response to a toggle information, and a step of determining whether the first data includes at least one error.

In a further embodiment of the inventive concept, the data processing method further comprises a step of generating the toggle information when the first data has a predetermined binary value pattern. The predetermined binary value pattern has the same value.

In a further embodiment of the inventive concept, the data processing method further comprises a step of storing the toggle information.

In an embodiment of an inventive concept, a data processing system for communicating a first data comprising a first data processing semiconductor device for transmitting the first data comprising data generator configured to provide a first data, a cyclic redundancy check (CRC) generator configured to generate a CRC information having at least one bit whose binary value is modified in response to a toggle information, and a data transmitter configured to combine the CRC information and the first data as a combined data and outputs the combined data in serial; a second data processing semiconductor device for receiving the first data comprising a data input buffer configured to receive a serial data having a CRC information and a data, a clock recovery circuit configured to reconstruct a clock from the serial data, a sampling circuit configured to sample the data based on the clock, a converter circuit configured to parallelize the serial data and split the CRC information having at least one different binary value and the data, a CRC detector configured to modify the CRC information in response to a toggle information, and an error checker configured to determine whether the data includes at least one error; and a transmission line configured to transmit the combined data from the first data processing semiconductor device to the second data processing device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
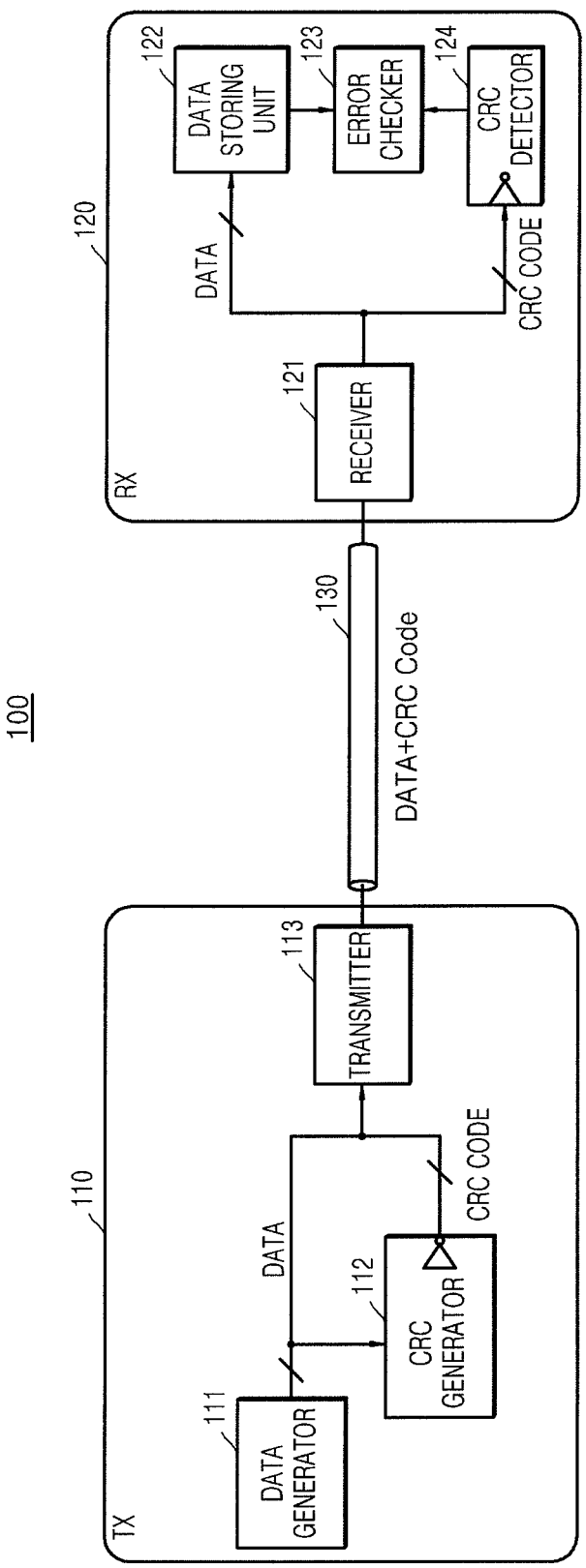
FIG. 1 is a block diagram of a data processing system according to an embodiment of the inventive concept.

To fully understand the inventive concept, the advantages of operations of the inventive concept, and the objects achieved by embodiments of the inventive concept, the accompanying drawings illustrating the embodiments of the inventive concept and details described therein must be referred to.

Hereinafter, the inventive concept will be described in detail by describing the embodiments of the inventive concept with reference to the accompanying drawings. Throughout the drawings, like reference numerals refer to like elements.

FIG. 1 is a block diagram of a data processing system according to an embodiment of the inventive concept. As shown in FIG. 1, a semiconductor system 100 includes one or more semiconductor devices 110 and 120 which transmit and receive data and signals therebetween. Each of the semiconductor devices 110 and 120 processes transmission and reception data, and thus, may be referred to as a first data processing device 110 and a second data processing device 120, respectively. In a description of a construction and operations shown in FIG. 1, it is assumed that the first data processing device 110 is a data transmission device and the second data processing device 120 is a data reception device. However, each of the first data processing device 110 and the second data processing device 120 may have both a circuit configuration for data transmission and a circuit configuration for data reception.

The first data processing device 110 may include a data generator 111, an error correction code generator 112, and a data transmitter 113. The second data processing device 120 may include a data receiver 121, a data storing unit 122, an error checker 123, and a code detector 124. The first data processing device 110 and the second data processing device 120 transmit and receive signals through a data transmission line 130. The first data processing device 110 generates an additional bit for transiting data and inserts the bit into the data for transmission of the data. For example, the first data processing device 110 may generate a code for error detection according to a predetermined scheme, and inserts the generated code into the data as the additional bit mentioned above.

The code for error detection may be generated according to various schemes. For example, a parity corresponding to a data block may be generated and inserted into the data. More specifically, a parity of one or more bits is generated for a data block composed of a plurality of data bits, and the generated parity is added to an end of the data or is inserted into the middle of the data. The code for error correction may be a cyclic redundancy check (CRC) code, and in this case, the first data processing device 110 may generate CRC information (e.g., a CRC code) by using transmission data, and the second data processing device 120 may perform CRC check on reception data including a CRC code to determine whether an error occurs during data transmission. In an embodiment of the inventive concept, the code for error detection is assumed to be a CRC code, and in this case, the error detection code generator 112 may be defined as a CRC generator and the code detector 124 may be defined as a CRC detector.

The detailed operations of the semiconductor system 100, the first data processing device 110, and the second data processing device 120 structured as shown in FIG. 1 will be described.

The data generator 111 generates data DATA. For example, the data generator 111 may include a memory cell array for storing the data DATA to provide the data DATA stored in the memory cell array through the data transmission line 130 in a data read operation. If the first data processing device 110 is a controller for controlling a memory device, the data generator 111 may be a data converter for converting various information, e.g., image information or voice information, into data suitable for memory storage. The CRC generator 112 receives the data DATA from the data generator 111 and generates a CRC Code CRC CODE by using the received data DATA. The data transmitter 113 receives data from the data generator 111 and the CRC Code CRC CODE from the CRC generator 112, combines them, and transmits combined data DATA+CRC CODE through the data transmission line 130.

The CRC generator 112 generates the CRC Code CRC CODE through a arithmetic operation with respect to the data DATA. For example, the CRC generator 112 may generate the CRC Code CRC CODE by using a shift register and one or more gate elements (e.g., an EX-OR element), and for example, may generate a 1-bit CRC code per data DATA of 8 bits. The generated CRC code is transmitted, together with the data DATA, through the data transmission line 130. If the first data processing device 110 transmits the data DATA and the CRC Code CRC CODE according to a serial-transmission scheme, parallel data is converted into serial data according to a predetermined frame format, the order of output data is determined, and the data is output. For example, according to a serial-transmission scheme, if the data DATA and the CRC Code CRC CODE are serially transmitted during n time intervals or n unit intervals, the CRC Code CRC CODE may be distributed and transmitted over the n time intervals (or n unit intervals) or may be transmitted during one of the n time intervals.

The CRC generator 112 inverts at least one bit of the CRC Code CRC CODE generated from the data DATA. In FIG. 1, the CRC generator includes an inverter for inverting the at least one bit of the generated CRC Code CRC CODE. Information regarding a position of a bit to be inverted in the CRC code may be previously set and stored in the first data processing device 110 and the second data processing device 120. By inverting the at least one bit of the CRC Code CRC CODE, the at least one bit is toggled in a pattern of the CRC Code CRC CODE.

By performing inversion on the CRC Code CRC CODE, it is possible to prevent values of all bits of the combined data DATA+CRC CODE from being equal to one another. For example, it is possible to prevent values of all bits of the combined data DATA+CRC CODE from being logic high (e.g., a value of "1") or logic low (e.g., a value of "0"). If all bits of the data DATA have values "0", all bits of the CRC Code CRC CODE may correspondingly have values "0". However, by performing the inverting operation on the CRC Code CRC CODE, some bits of the CRC Code CRC CODE are toggled. Even when the CRC Code CRC CODE is generated as "10101010" according to a predetermined binary value pattern of the data DATA and the bit values of the generated CRC Code CRC CODE change to all "0" through inversion on even-numbered bits, the combined data DATA+CRC CODE is toggled at least once, and thus, all bit values of the combined data DATA+CRC CODE are not equal to one another.

The CRC generator 112 may perform a predetermined determination operation and control a toggling operation with respect to the CRC Code CRC CODE according to a result of the determination operation. For example, the CRC generator 112 may determine whether the data DATA and the CRC Code CRC CODE corresponding thereto include at least one bit which is to be toggled. If both the data DATA and the CRC Code CRC CODE do not include any toggling bit, the CRC generator 112 may invert at least one bit of the CRC Code CRC CODE.

The data transmitter 113 combines the data DATA and the CRC Code CRC CODE to generate the combined data DATA+CRC CODE, and transmits the combined data DATA+CRC CODE through the data transmission line 130. The combined data DATA+CRC CODE transmitted through the data transmission line 130 is received by the data receiver 121 of the second data processing apparatus 120. The data receiver 121 receives the combined data DATA+CRC CODE, splits it into the data DATA and the CRC Code CRC CODE, provides the data DATA to the data storing unit 122, and provides the CRC Code CRC CODE to the CRC detector 124. The CRC detector 124 then temporarily stores the received CRC Code CRC CODE and inverts at least some bits of the received CRC Code CRC CODE to detect the original CRC Code CRC CODE. The error checker 123 determines if the received data DATA has an error based on an arithmetic operation using the data DATA and the CRC Code CRC CODE, and generates a detection result. The second data processing device 120 may perform an operation, such as of providing a command requesting retransmission of the data DATA to the first data processing device 110, in response to the detection result of the error checker 123.

According to the constructions and operations described above, the first data processing device 110 adds a code for error correction, such as a CRC code, to the data DATA as a transition bit and transmits the code-added data DATA. Since bit values of the CRC Code CRC CODE depend on a binary value pattern of the data DATA to be transmitted, the CRC code may have bit values of all "0" according to the binary value pattern of the data DATA. Therefore, by further including an inverter for inverting at least one bit value of the CRC Code CRC CODE, the CRC generator 112 generates the CRC Code CRC CODE whose some bit values are inverted.

The second data processing device 120 receives the combined data DATA+CRC CODE, tracks a phase of a clock signal (not shown) to transition of the combined data DATA+CRC CODE or low-to-high or high-to-low signal edge of the combined data DATA+CRC CODE, and samples the data DATA and the CRC Code CRC CODE by using the tracked clock signal. The second data processing device 120 splits the data DATA and the CRC Code CRC CODE from the combined data DATA+CRC CODE, outputs the data DATA to the data storing unit 122, and outputs the CRC code to the CRC detector 124. The CRC detector 124 then inverts at least one bit of the received CRC Code CRC CODE and outputs the inverted CRC Code CRC CODE, and the error checker 123 detects if an error occurs in the data DATA based on a arithmetic operation using the data DATA and the CRC Code CRC CODE output from the CRC detector 124.

Figure 2:
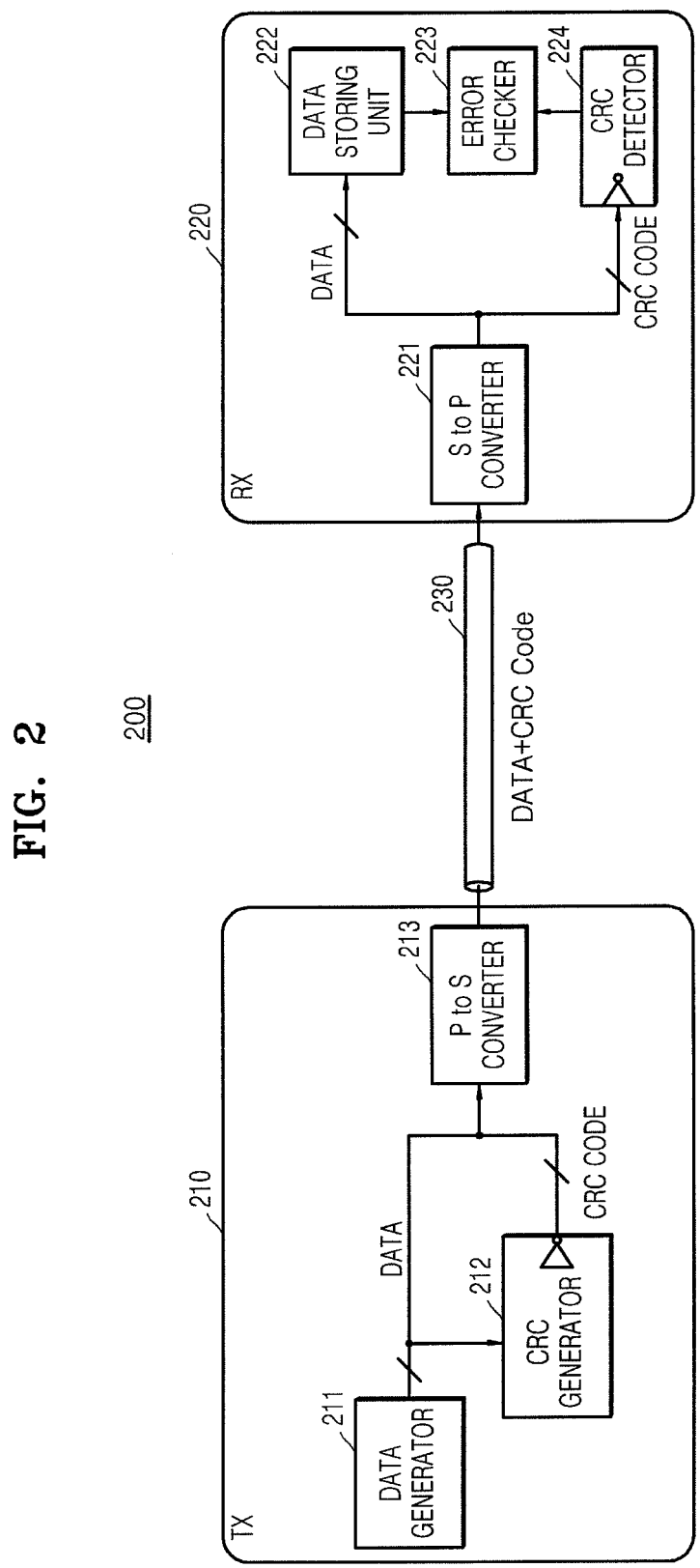
FIG. 2 is a block diagram of a data processing system according to another embodiment of the inventive concept.

FIG. 2 is a block diagram of a data processing system according to another embodiment of the inventive concept. As shown in FIG. 2, a semiconductor system 200 may include a first data processing device 210 and a second data processing device 220. As mentioned previously, the first data processing device 210 and the second data processing device 220 each may be one of a semiconductor chip, a semiconductor device, and a semiconductor system which performs transmission or reception of data. In a description of the semiconductor system 200 shown in FIG. 2, the same constructions as shown in FIG. 1 are the same as or similar to the constructions described in FIG. 1 and thus will not be described in detail. In addition, it is assumed that the first data processing device 210 is a data transmission device and the second data processing device 220 is a data reception device.

The first data processing device 210 may include a data generator 211, a CRC generator 212, and a parallel-to-serial converter 213. The second data processing device 220 may include a serial-to-parallel converter 221, a data storing unit 222, an error checker 223, and a CRC detector 224. A data transmission line 230 may be disposed in the semiconductor system 200 for data transmission/reception between the first data processing device 210 and the second data processing device 220.

The data generator 211 generates data DATA to be provided to the second data processing device 220. The CRC generator 212 receives the data DATA and generates a CRC Code CRC CODE based on a arithmetic operation using the received data DATA. The CRC generator 212 inverts at least one bit of the generated CRC Code CRC CODE to toggle at least one bit of combined data DATA+CRC CODE. The parallel-to-serial converter 213 combines the data DATA and the CRC Code CRC CODE and converts the combined data DATA+CRC CODE from a parallel form into a parallel form according to a predetermined frame format. The parallel-to-serial converter 213 may include an output driver (not shown) for transmitting the combined data DATA+CRC CODE through the data transmission line 230. In regard to an inverting operation with respect to the CRC Code CRC CODE, for example, by inverting an $n^{th}$ bit of the CRC Code CRC CODE, at least one bit of the CRC Code CRC CODE is toggled and thus, even when all bits of the data DATA to be transmitted have values "0", all bits of the combined data DATA+CRC CODE may not have values "0".

The combined data DATA+CRC CODE transmitted through the data transmission line 230 is received by the serial-to-parallel converter 221 of the second data processing device 220. The serial-to-parallel converter 221 may include an input buffer (not shown) for receiving the combined data DATA+CRC CODE transmitted through the data transmission line 230. The serial-to-parallel converter 221 converts the combined data DATA+CRC CODE received in a serial form into a parallel form and splits the combined data DATA+CRC CODE converted into the parallel form to generate the data DATA and the CRC Code CRC CODE. The serial-to-parallel converter 221 provides the data DATA to the data storing unit 222 and provides the CRC Code CRC CODE to the CRC detector 224. The CRC detector 224 then inverts at least one bit of the received CRC Code CRC CODE to detect the original CRC Code CRC CODE. The error checker 223 performs a arithmetic operation by using the data DATA and the CRC Code CRC CODE generated from the CRC detector 224, detects if an error occurs in the received data DATA based on a calculation result, and generates a detection result. If it is detected that an error occurs in the received data DATA, the error checker 223 may send the detection result to the first data processing device 210 through the data transmission line 230 to request that the first data processing device 210 sends again the data DATA. In an alternative embodiment, the error checker 223 may send the detection result through a separate line from the transmission line 210.

Figure 3:
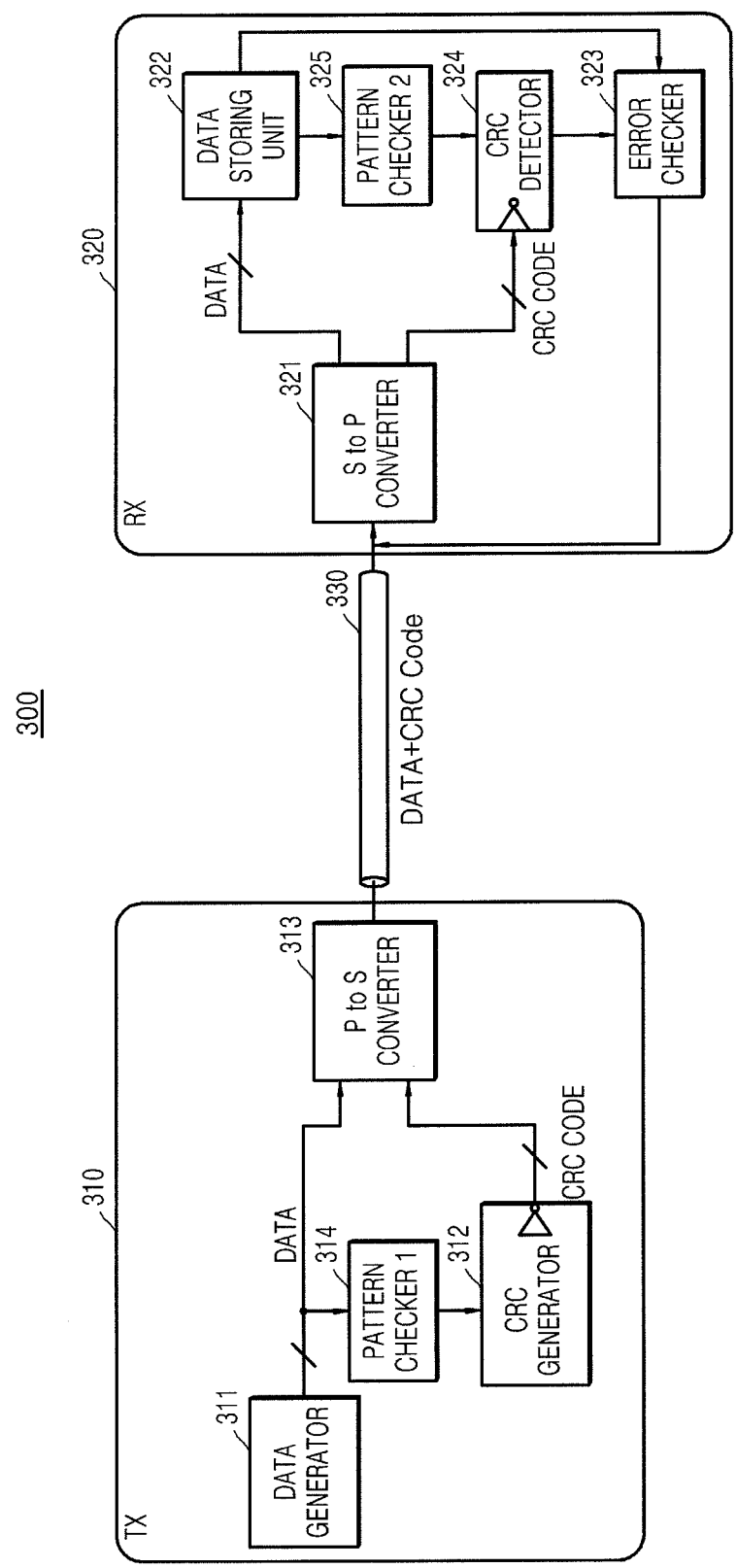
FIG. 3 is a block diagram of a data processing system according to another embodiment of the inventive concept.

FIG. 3 is a block diagram of a data processing system according to another embodiment of the inventive concept. As shown in FIG. 3, a semiconductor system 300 may include a first data processing device 310 and a second data processing device 320. As mentioned previously, the first data processing device 310 and the second data processing device 320 each may be one of a semiconductor chip, a semiconductor device, and a semiconductor system which performs transmission or reception of data.

The first data processing device 310 may include a data generator 311, a CRC generator 312, a parallel-to-serial converter 313, and a first pattern checker 314. The second data processing device 320 may include a serial-to-parallel converter 321, a data storing unit 322, an error checker 323, a CRC detector 324, and a second pattern checker 325. A data transmission line 330 may also be disposed in the semiconductor system 300 for data transmission/reception between the first data processing device 310 and the second data processing device 320.

In operation, the data generator 311 generates data DATA to be provided to the second data processing device 320. The first pattern checker 314 checks a binary value pattern of the data DATA provided from the data generator 311 and outputs a toggle information. For example, the first pattern checker 314 checks if the binary value pattern of the data DATA is the same as a previously set pattern, outputs a toggle information, and preferably, checks if the binary value pattern of the data DATA has bit values of all "0" and outputs a toggle information. The toggle information output from the first pattern checker 314 is provided to the CRC generator 312 which then controls an inverting operation with respect to the CRC Code CRC CODE by using the toggle information.

More specifically, the CRC generator 312 receives the data DATA and generates the CRC Code CRC CODE based on a arithmetic operation using the data DATA. Although not shown in FIG. 3, the CRC generator 312 may receive the data DATA directly from the data generator 311 or receive both the data DATA and the toggle information from the first data pattern checker 314. If the toggle information indicates a first state, the CRC generator 312 outputs the generated CRC Code CRC CODE without performing an inverting operation with respect to the generated CRC Code CRC CODE. On the other hand, if the toggle information indicates a second state, the CRC generator 312 generates the CRC Code CRC CODE and outputs the CRC Code CRC CODE at least one bit of which is inverted. If the binary value pattern of the data DATA has bit values of all "0", the CRC generator 312 inverts at least one bit of the CRC Code CRC CODE, and for example, may invert a bit value at a previously set position in the CRC Code CRC CODE.

The parallel-to-serial converter 313 combines the data DATA and the CRC Code CRC CODE to generate the combined data DATA+CRC CODE, and provides the combined data DATA+CRC CODE to the second data processing device 320 through the data transmission line 330 according to a serial-transmission scheme.

The serial-to-parallel converter 321 of the second data processing device 320 receives the combined data DATA+CRC CODE and converts the received combined data DATA+CRC CODE into a parallel form. The serial-to-parallel converter 321 splits the combined data DATA+CRC CODE into the data DATA and the CRC Code CRC CODE, provides the data DATA to the data storing unit 322, and provides the CRC Code CRC CODE to the CRC detector 324. The second data pattern checker 325 checks if the binary value pattern of the data DATA is the same as a previously set pattern, and for example, may check if the binary value pattern of the data DATA has bit values of all "0". The second data pattern checker 325 provides a toggle information to the CRC detector 324 which then inverts at least one bit of the CRC Code CRC CODE in response to the toggle information. The error checker 323 performs an arithmetic operation by using the data DATA and the CRC Code CRC CODE output from the CRC detector 324, detects if an error occurs in the data DATA based on the arithmetic operation, and outputs a detection result ERROR. The detection result ERROR may be provided to the first data processing device 310, and for example, may be provided to the first data processing device 310 through the data transmission line 330.

Figure 4:
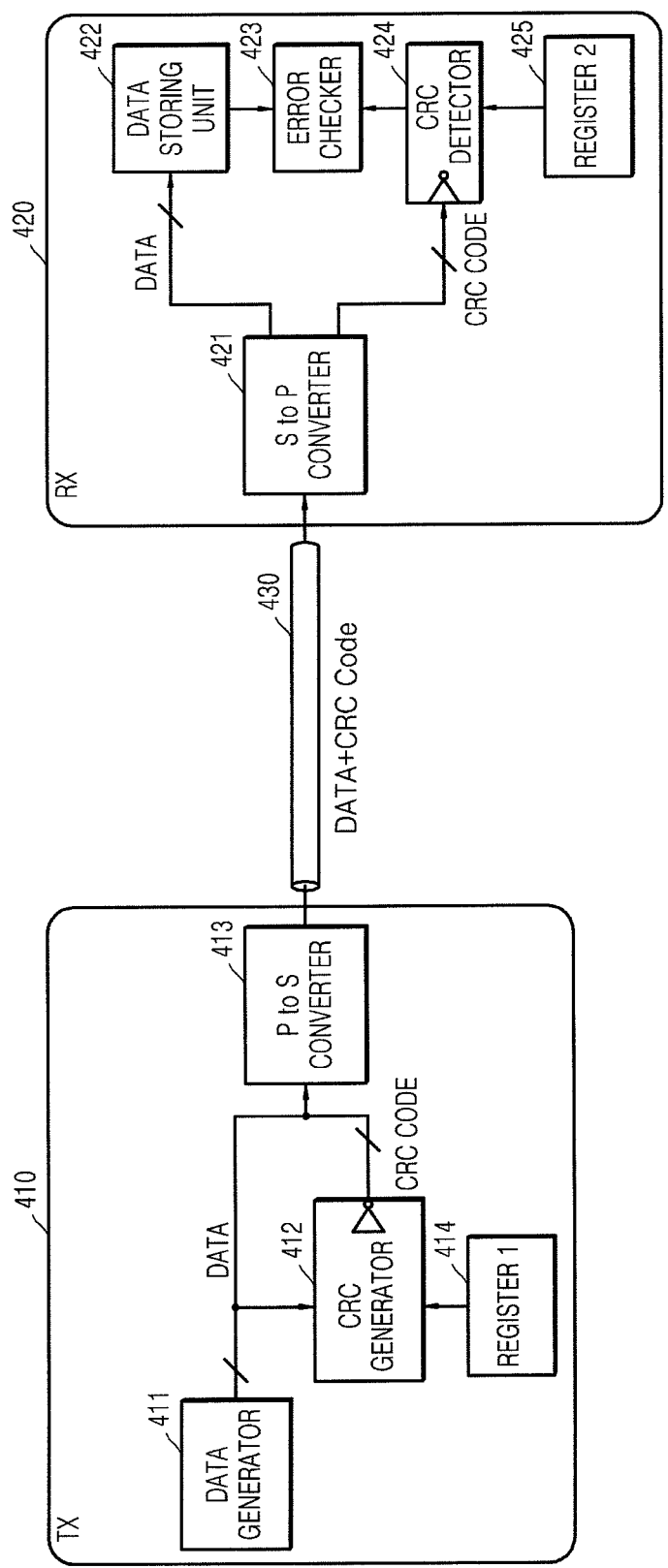
FIG. 4 is a block diagram of a data processing system according to another embodiment of the inventive concept.

FIG. 4 is a block diagram of a data processing system according to another embodiment of the inventive concept. As shown in FIG. 4, a semiconductor system 400 may include a first data processing device 410 and a second data processing device 420. As mentioned previously, the first data processing device 410 and the second data processing device 420 each may be one of a semiconductor chip, a semiconductor device, and a semiconductor system which performs transmission or reception of data.

The first data processing device 410 may include a data generator 411, a CRC generator 412, a parallel-to-serial converter 413, and a first information register 414. The second data processing device 420 may include a serial-to-parallel converter 421, a data storing unit 422, an error checker 423, a CRC detector 424, and a second information register 425. A data transmission line 430 may also be disposed in the semiconductor system 400 for data transmission/reception between the first data processing device 410 and the second data processing device 420.

In operation, the data generator 411 generates data DATA to be provided to the second data processing device 420, and provides the generated data DATA to the CRC generator 412. The first information register 414 stores toggle information (e.g., first information) for toggling at least one bit of the CRC Code CRC CODE, and preferably, stores information associated with a particular bit to be inverted in the CRC Code CRC CODE generated using the data DATA. For example, if an $a^{th}$ bit of the CRC Code CRC CODE is to be inverted and transmitted, the first information register 414 stores information associated with a position of the $a^{th}$ bit of the CRC Code CRC CODE. If odd-numbered bits of the CRC Code CRC CODE are to be inverted and transmitted, information associated with positions of the odd-numbered bits of the CRC Code CRC CODE is stored. The first information stored in the first information register 414 is provided to the CRC generator 412.

The CRC generator 412 receives the data DATA and the first information and generates the CRC Code CRC CODE in response thereto. For example, the CRC generator 412 generates the CRC Code CRC CODE based on an arithmetic operation using the data DATA, and inverts one or more particular bits of the CRC Code CRC CODE and outputs the CRC Code CRC CODE the one or more bits of which are inverted. The parallel-to-serial converter 413 combines the data DATA and the CRC Code CRC CODE to generate combined data DATA+CRC CODE, and provides the combined data DATA+CRC CODE to the second data processing device 420 through the data transmission line 430 according to a serial-transmission scheme.

The serial-to-parallel converter 421 of the second data processing device 420 receives the combined data DATA+CRC CODE and converts the received combined data DATA+CRC CODE into a parallel form. The serial-to-parallel converter 421 splits the combined data DATA+CRC CODE into the data DATA and the CRC Code CRC CODE, provides the data DATA to the data storing unit 422, and provides the CRC Code CRC CODE to the CRC detector 424. The second information register 425 stores toggle information (e.g., second information) associated with a particular bit to be inverted, and provides the stored second information to the CRC detector 424. The second information stored in the second information register 425 may be substantially the same as the first information stored in the first information register 414, and thus, some bits of the CRC Code CRC CODE inverted in the first data processing device 410 are inverted again in the second data processing device 420. The error checker 423 performs an arithmetic operation by using the data DATA and the CRC Code CRC CODE generated from the CRC detector 424, detects if an error occurs in the data DATA based on the arithmetic operation, and outputs a detection result.

Figure 5:
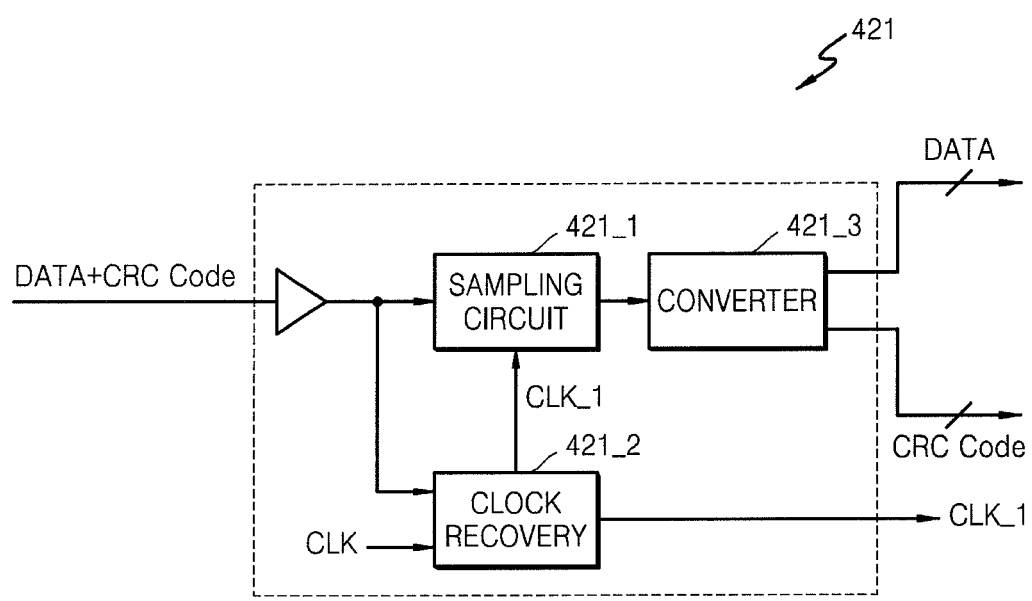
FIG. 5 is a block diagram of an exemplary implementation of a serial-to-parallel converter of a second data processing device shown in FIG. 4.

FIG. 5 is a block diagram of an exemplary implementation of the serial-to-parallel converter 421 of the second data processing device 420 shown in FIG. 4. The serial-to-parallel converter 421 may include a sampling circuit 421_1, a clock recovery circuit 421_2, a converter 421_3, and an input buffer 421_4.

In operation, the serial-to-parallel converter 421 receives the combined data DATA+CRC CODE and splits the same to generate the data DATA and the CRC Code CRC CODE. For example, the serial-to-parallel converter 421 may sample the data DATA and the CRC Code CRC CODE from the combined data DATA+CRC CODE according to a CDR (Clock and Data Recovery) scheme.

The combined data DATA+CRC CODE is received at the input buffer 421_4 through the data transmission line 430 of FIG. 4. The buffered combined data DATA+CRC CODE is provided to the sampling circuit 421_1 and the clock recovery circuit 421_2. The clock recovery circuit 421_2 receives a clock signal CLK and tracks a phase of the clock signal CLK to transition of the combined data DATA+CRC CODE or low-to-high or high-to-low signal edge of the combined data DATA+CRC CODE. Since a transmission device (not shown) inverts at least one bit of the CRC Code CRC CODE, at least one bit of the combined data DATA+CRC CODE is toggled even when the data DATA has bit values of all "0". A tracked clock signal CLK_1 is provided to the sampling circuit 421_1 which then samples the combined data DATA+CRC CODE by using the tracked clock signal CLK_1. The data DATA and the CRC Code CRC CODE which are sampled by the sampling circuit 421_1 are provided to the converter 421_3 which then converts the data DATA and the CRC Code CRC CODE into a serial form.

While the exemplary implementation of the serial-to-parallel converter 421 of FIG. 4 is shown in FIG. 5, the structure shown in FIG. 5 may be implemented identically or similarly also in the foregoing embodiments. For example, the data receiver or the serial-to-parallel converter provided in the second data processing device mentioned in the foregoing embodiments may sample the data DATA and the CRC Code CRC CODE according to a CDR scheme, and in this case, each of the data receiver and the serial-to-parallel converter may include a sampling circuit and a clock recovery circuit.

Figure 6:
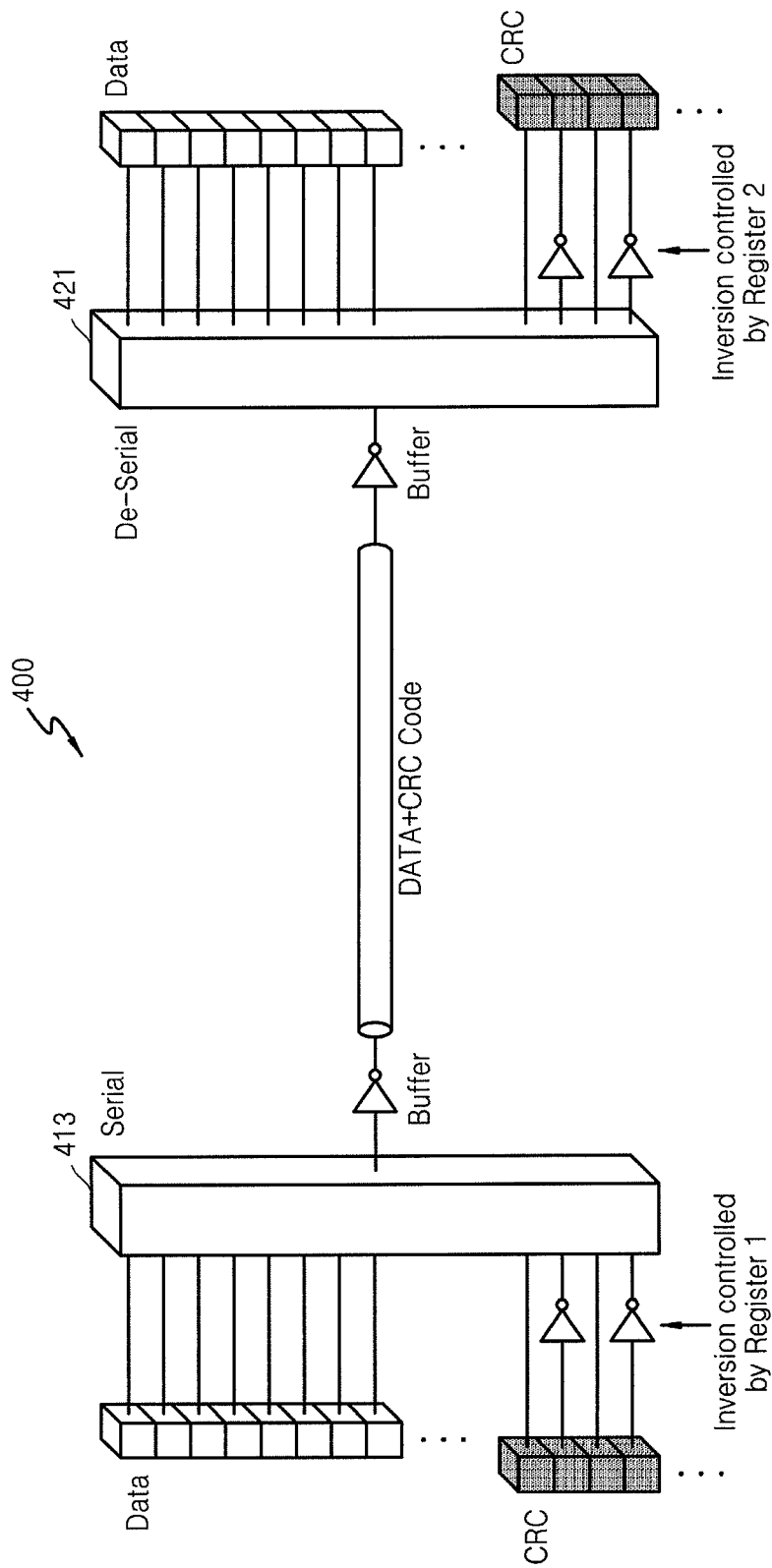
FIG. 6 is a diagram showing an example of transmission of data and a cyclic redundancy check (CRC) code in the semiconductor system shown in FIG. 4.

FIG. 6 is a diagram showing an example of transmission of data and a CRC code in the semiconductor system 400 shown in FIG. 4. Referring to FIGS. 4 and 5, the data DATA and the CRC Code CRC CODE in the first data processing device 410 are provided to the parallel-to-serial converter 413. At this time, one or more particular bits of the CRC Code CRC CODE are inverted and provided to the parallel-to-serial converter 413. Positions of the bits to be inverted in the CRC Code CRC CODE may be controlled using the first information stored in the first information register 414. The parallel-to-serial converter 413 combines the data DATA and the CRC Code CRC CODE whose particular bits are inverted, and serially transmits the combined data DATA+CRC CODE through an output buffer. The serial-to-parallel converter 421 of the second data processing device 420 receives the combined data DATA+CRC CODE through an input buffer and splits the combined data DATA+CRC CODE into the data DATA and the CRC Code CRC CODE. One or more particular bits of the splitted CRC Code CRC CODE are inverted and positions of the bits to be inverted may be controlled using the second information stored in the second information register 425.

Figure 7:
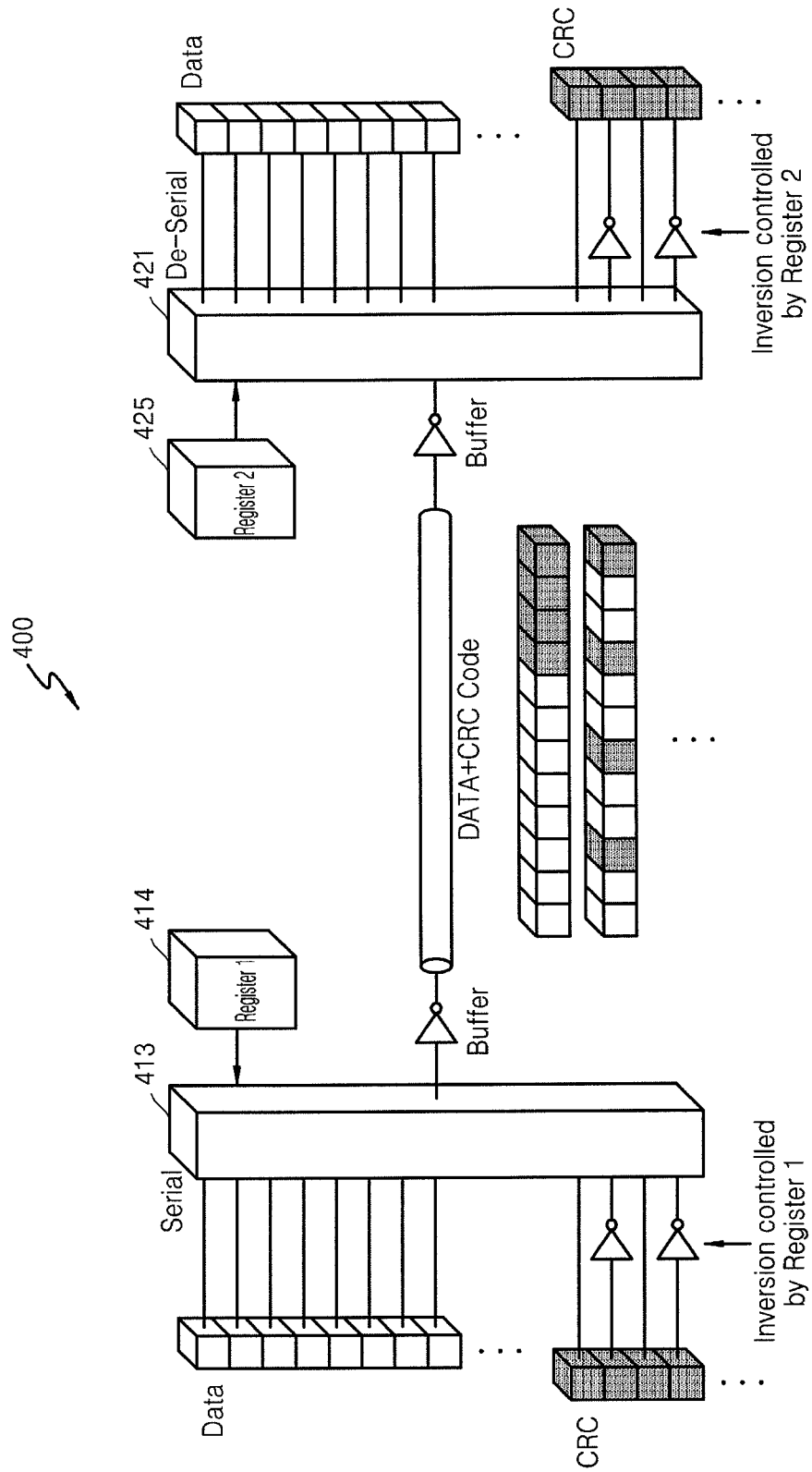
FIG. 7 is a diagram showing another example of transmission of data and a cyclic redundancy check (CRC) code in the semiconductor system shown in FIG. 4.

FIG. 7 is a diagram showing another example of transmission of data and a CRC code in the semiconductor system 400 shown in FIG. 4. Referring to FIGS. 4 and 7, the data DATA and the CRC Code CRC CODE in the first data processing device 410 are provided to the parallel-to-serial converter 413 which then combines the data DATA and the CRC Code CRC CODE. The combined data DATA+CRC CODE is converted from parallel data into serial data according to a predetermined frame format.

The first information register 414 in the first data processing device 410 further stores information associated with a transmission order of the data DATA and the CRC Code CRC CODE to be transmitted from the parallel-to-serial converter 413 in addition to information associated with positions of bits to be inverted in the CRC Code CRC CODE. The first information register 414 provides such information to the CRC generator 412 and the parallel-to-serial converter 413. The CRC generator 412 inverts one or more bits at particular positions in the CRC Code CRC CODE in response to the information, and the parallel-to-serial converter 413 configures a frame format with the data DATA and the CRC Code CRC CODE by using the information associated with the transmission order provided from the first information register 414 to combine the data DATA and the CRC Code CRC CODE. The combined data DATA+CRC CODE is serially transmitted through the output buffer according to the configured frame format. In FIG. 7, in association with the transmission order, two cases are shown in which the CRC Code CRC CODE is added at the end of the data DATA and transmitted and in which bits of the CRC Code CRC CODE are inserted into the middle of the data DATA and transmitted.

The serial-to-parallel converter 421 of the second data processing device 420 receives the combined data DATA+CRC CODE through the input buffer and splits the combined data DATA+CRC CODE into the data DATA and the CRC Code CRC CODE. The second information register 425 further stores information associated with a transmission order of the data DATA and the CRC Code CRC CODE to be transmitted from the first data processing device 410 in addition to information associated with positions of bits to be inverted in the CRC Code CRC CODE. The serial-to-parallel converter 421 splits the combined data DATA+CRC CODE into the data DATA and the CRC Code CRC CODE by using such information stored the second information register 425. The CRC detector 424 inverts one or more particular bits of the CRC Code CRC CODE by using the information stored in the second information register 425 and outputs the inverted CRC Code CRC CODE.

In the current embodiment and the foregoing embodiments, to invert the CRC Code CRC CODE, a data transmission device inverts the CRC Code CRC CODE in a CRC generator, and a data reception device also inverts the CRC Code CRC CODE in a CRC detector. However, the embodiment of the inventive concept is not limited thereto. For example, a data transmission device may include one or more inverters in a data transmitter or a parallel-to-serial converter and information indicating positions of bits to be inverted may be provided to the data transmitter or a the parallel-to-serial converter. Likewise, a data reception device may include one or more inverters in a data receiver or a serial-to-parallel converter and information indicating positions of bits to be inverted may be provided to the data receiver or the serial-to-parallel converter.

Figure 8:
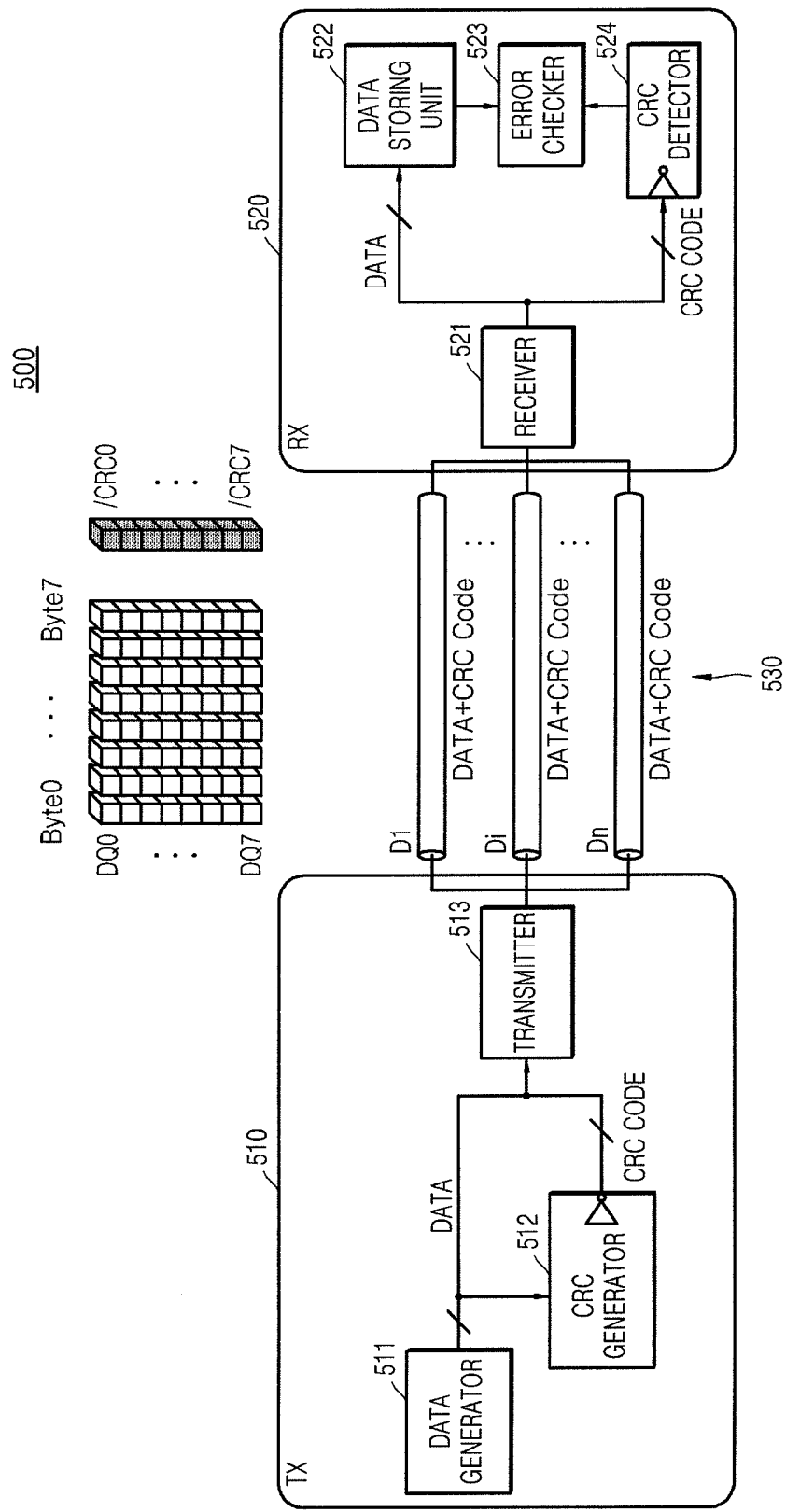
FIG. 8 is a block diagram of a data processing system according to another embodiment of the inventive concept.

FIG. 8 is a block diagram of a data processing system according another embodiment of the inventive concept. As shown in FIG. 8, a semiconductor system 500 may include a first data processing device 510 and a second data processing device 520. The first data processing device 510 may include a data generator 511, a CRC generator 512, and a data transmitter 513, and the second data processing device 520 may include a data receiver 521, a data storing unit 522, an error checker 523, and a CRC detector 524. A data transmission line 530 for parallel data transmission between the first data processing device 510 and the second data processing device 520 may also be disposed in the semiconductor system 500.

In the semiconductor system 500 shown in FIG. 8, the first data processing device 510 and the second data processing device 520 communicate the combined data DATA+CRC CODE in parallel through the data transmission line 530 having multiple channels. The CRC generator 512 performs an arithmetic operation on the data DATA from the data generator 511 to generate the CRC Code CRC CODE, and toggles (or inverts) at least one bit of the CRC Code CRC CODE. The data transmitter 513 combines the data DATA and the CRC Code CRC CODE to generate the combined data DATA+CRC CODE, and transmits the combined data DATA+CRC CODE to the second data processing device 520 in parallel through n channels. For example, if the data transmission line 530 includes 8 channels, first data through eighth data DQ0-DQ7 are transmitted in parallel through the data transmission line 530 and, after the data DATA of 8 bytes is transmitted according to such a parallel-transmission scheme, the CRC Code CRC CODE may be transmitted through the data transmission line 530.

First through eighth CRC codes/CRC0-/CRC7 shown in FIG. 8 are CRC codes generated to correspond to the 8-byte data DATA and at least one bit of each CRC code has been inverted. Assuming that 8 bits of the data DATA and each 1-bit CRC Code CRC CODE are sequentially transmitted through each channel of the data transmission line 530, when the 8 bits of the data DATA have values of all "0", the CRC Code CRC CODE may also have a bit value of "0", whereby bit values of combined data DATA+CRC CODE transmitted through a channel may be all "0". To prevent this phenomenon, the CRC Code CRC CODE transmitted through each channel of the data transmission line 530 may be inverted at all times. For example, when the first through eighth CRC code/CRC0-/CRC7 are transmitted in parallel through the 8 channels, respectively, the first through eighth CRC code/CRC0-/CRC7 are inverted codes of the original CRC codes CRC0-CRC7 generated from the CRC code generator 512.

When the combined data DATA+CRC CODE is transmitted in parallel and the CRC Code CRC CODE is generated based on a summation operation of the data DATA, the CRC Code CRC CODE corresponding to the data DATA which have bit values of all "1" may also have a bit value of "1". For example, if data (8-byte data DATA) shown in FIG. 8 has bit values of all "1", the CRC Code CRC CODE generated through a arithmetic operation with respect to the data may have bit values of "1" or "0". Thus, in some of the 8 channels, bit values of the data DATA and the CRC Code CRC CODE may have bit values of all "1", whereby toggling may not occur in the combined data DATA+CRC CODE transmitted through those channels.

Information associated with an arithmetic equation for generating the CRC Code CRC CODE is previously set in a data transmission device and a data reception device, such that when the data DATA has bit values of all "1", positions of bits having values of "1" among bits of the CRC Code CRC CODE may be known. Therefore, when the data DATA has bit values of all "1", information for inverting particular bits of the CRC Code CRC CODE may be further stored in the data transmission device or the data reception device. The pattern checker for checking the binary value pattern of the data DATA described in the foregoing embodiment may further check if the data DATA has bit values of all "1". If the data DATA to be transmitted has bit values of all "1", the inverting operation is performed on the CRC Code CRC CODE according to the information for inverting particular bits of the CRC Code CRC CODE. The data reception device also checks if the received data DATA has bit values of all "1" and performs the inverting operation with respect to the CRC Code CRC CODE according to a toggle information.

Figure 9:
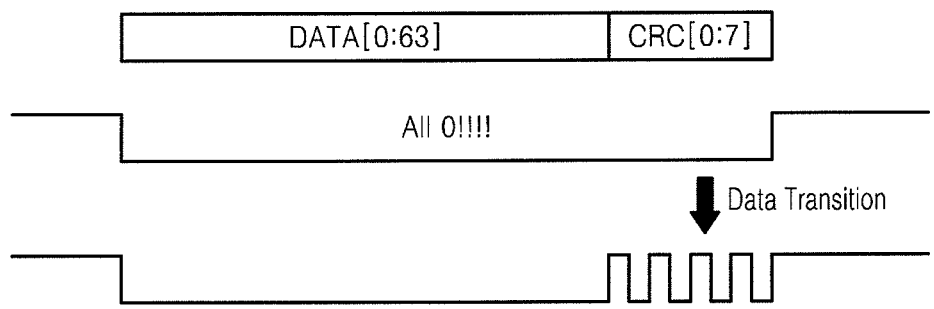
FIG. 9 is a diagram showing an example of generation and transmission of a CRC code in a semiconductor system according to an embodiment of the inventive concept.

FIG. 9 is a diagram showing an example of generation and transmission of a CRC code in a semiconductor system according to an embodiment of the inventive concept. As shown in FIG. 9, 8-bit CRC codes CRC [0:7] are generated to correspond to 64-bit (or 8-byte) data DATA [0:63], and combined data of the data DATA [0:63] and the CRC codes CRC [0:7] may be transmitted through a data transmission line. The CRC codes CRC [0:7] may be generated by performing an arithmetic operation on the data DATA [0:63], and for example, if the CRC codes CRC [0:7] are generated based on a summation operation of the data DATA [0:63], all bits of the CRC codes CRC [0:7] have values of "0" when all bits of the data DATA [0:63] have values of "0". In this case, all bit values of the combined data may also be "0", whereby data transition does not occur and thus a device receiving the transmitted combined data cannot properly sample the combined data.

Consequently, a semiconductor system according to an embodiment of the inventive concept sets a protocol for toggling at least one bit of a CRC Code CRC CODE and allows transmission of data DATA and the CRC Code CRC CODE between data processing devices according to the set protocol. As shown in FIG. 8, a protocol may be set to invert odd-numbered bits of a CRC Code CRC CODE composed of multiple bits, or may be set to invert even-numbered bits of the CRC Code CRC CODE. Alternatively, as mentioned in the foregoing embodiment, a protocol may be set to invert one or more particular bits or may be set to invert at least one bit of the CRC Code CRC CODE when all bits of the data DATA has values of all "0" as a result of detection of the binary value pattern of the data DATA.

Figure 10:
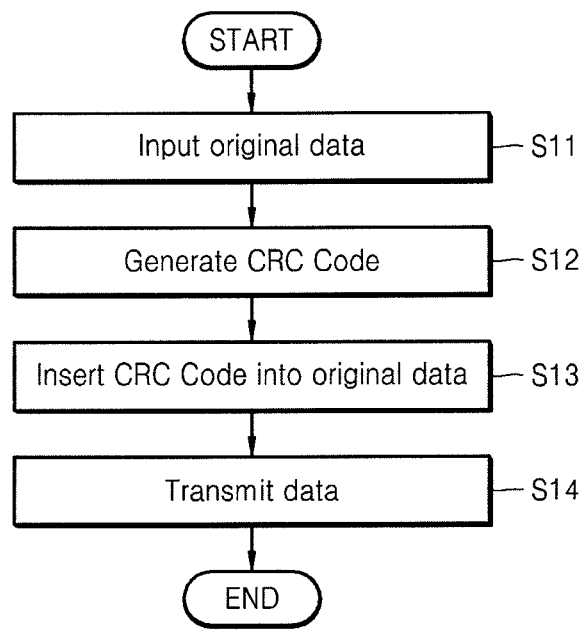
FIG. 10 is a flowchart showing a data processing method according to an embodiment of the inventive concept.

FIG. 10 is a flowchart showing a data processing method according to an embodiment of the inventive concept. In particular, FIG. 10 shows an operating method of a data processing device which transmits combined data of data DATA and a CRC Code CRC CODE.

As shown in FIG. 10, upon generation of original data in a data transmission device, a logic block for generating a CRC code receives the original data in operation S11 and performs an arithmetic operation on the received original data to generate the CRC code in operation S12. In particular, the logic block for generating the CRC code toggles at least one bit of the generated CRC code. To this end, for example, the logic block inverts one or more previously set bits of the CRC code, or detects a pattern of the original data and inverts or does not invert at least one bit of the CRC code according to a detection result. If all bits of the original data have values of "0", at least one bit of the CRC code may be inverted.

As such, upon generation of the CRC code whose at least one bit is toggled, the CRC code is added to the original data to generate combined data in operation S13, and the generated combined data is provided to a data reception device through a data transmission line in operation S14. While the data processing method according to the current embodiment of the inventive concept has been described with reference to an example of an operation of the semiconductor system 100 shown in FIG. 1, the data processing method is not limited thereto. That is, the data processing method according to the current embodiment of the inventive concept may be applied to the foregoing another embodiments, for example, a scheme for serially transmitting the combined data, a scheme for transmitting the combined data in parallel, a scheme for inverting particular bits of the CRC code by using information stored in a register regardless of a pattern of the original data, and a scheme for selectively inverting particular bits of the CRC code according to the pattern of the original data.

Figure 11:
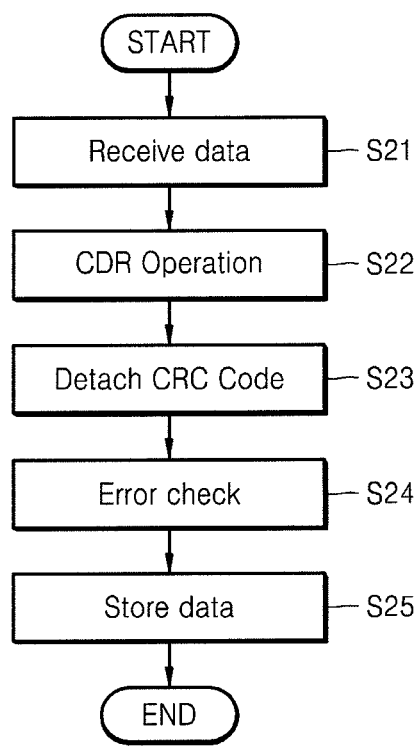
FIG. 11 is a flowchart showing a data processing method according to another embodiment of the inventive concept.

FIG. 11 is a flowchart showing a data processing method according to another embodiment of the inventive concept. In particular, FIG. 11 shows an operating method of a data processing device which receives combined data of data DATA and a CRC Code CRC CODE.

As shown in FIG. 11, a data reception device receives combined data transmitted through a data transmission line in operation S21. The data reception device performs sampling on the combined data based on a CDR operation in operation S22. The data reception device splits data and a CRC code from the combined data in operation S23. To correspond to inversion of at least one bit of the CRC code at a data transmission stage in transmission of the combined data, the data reception device inverts at least one bit of the CRC code splitted from the combined data. Information regarding bits to be inverted in the CRC code may be obtained by the data reception device according to various schemes. For example, the data transmission device may additionally transmit separate information in addition to the combined data, and the additionally transmitted information may include information indicating positions of inverted bits in the CRC code. Alternatively, bit position information for inverting particular bits of the CRC code may be previously set and stored in registers of the data transmission device and the data reception device. The data reception device inverts particular bits of the CRC code separated from the combined data by referring to the information stored in the registers.

Once separation from the combined data and detection of the CRC code have been completed, the data reception device checks if an error occurs by using the CRC code in operation S24. If the error occurs, a retransmission request of the data is provided to the data transmission device. If the error does not occur, the original data obtained as described above is stored in a data storing unit of the data reception device in operation S25.

Figure 12:
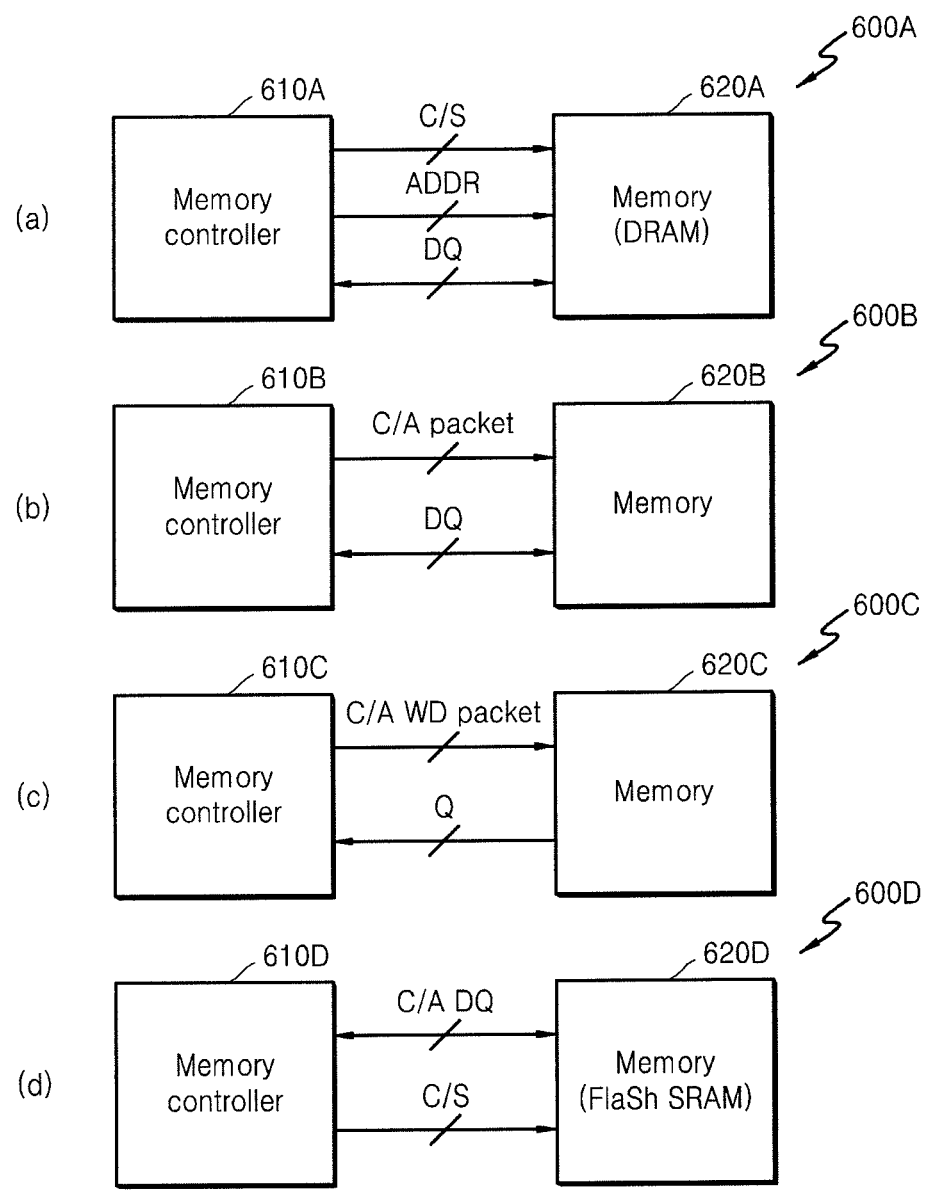
FIGS. 12A through 12D are block diagrams of application examples of a memory system including a memory controller and a memory device, according to the inventive concept.

FIGS. 12A through 2D are block diagrams of application examples of a memory system including a memory controller and a memory device, according to the inventive concept.

Referring to a memory system 600A of FIG. 12A, a bus protocol between a memory controller 610A and a memory device (e.g., a dynamic random access memory (DRAM)) 620A is disclosed in which a control signal C/S such as /CS, CKE, /RAS, /CAS, /WE, etc. and an address signal ADDR are provided to the memory device 620A. Data DQ is bi-directionally transmitted. When the memory controller 610A provides a CRC code, together with write data, to the memory device 620A, the memory controller 610A may operate as a data transmission device and the memory device 620A may operate as a data reception device in the foregoing embodiments. Since data is bi-directionally transmitted between the memory controller 610A and the memory device 620A through the same data channel, a protocol for inverting a CRC code may be used commonly in write-data transmission and read-data transmission.

Referring to a memory system 600B of FIG. 12B, packetized control signals and address signals C/A Packet from a memory controller 610B are provided to a memory device 620B and data DQ is bi-directionally transmitted. Each of the memory controller 610B and the memory device 620B may operate as both a data transmission device and a data reception device.

Referring to a memory system 600C of FIG. 12C, packetized control signals and address signals and write signals C/A/WD Packet from a memory controller 610C are provided to a memory device 620C and a data output Q is uni-directionally transmitted from the memory device 620C to the memory controller 610C. A protocol which applies CRC-code inversion in one of transmission of write data WD and transmission of read data Q may be used, or a protocol which applies CRC-code inversion in both transmission of the write data WD and transmission of the read data Q may be used. Different protocols may be applied to transmission of the write data WD and transmission of the read data Q.

Referring to a memory system 600D of FIG. 12D, control signals C/S from a memory controller 610D are provided to a memory device 620D, e.g., a flash static random access memory (SRAM), and commands, addresses, and data C/A/DQ are bi-directionally transmitted.

Figure 13:
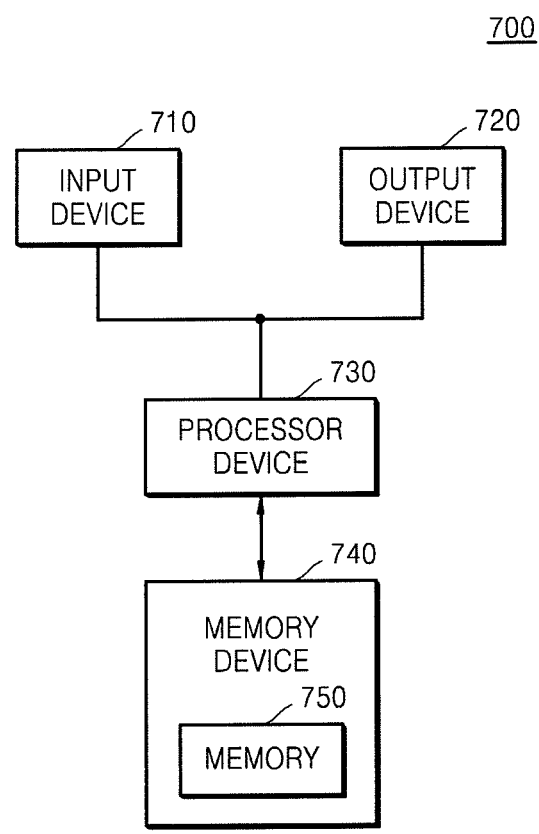
FIG. 13 is a block diagram of an application example of an electronic system including a semiconductor device according to the inventive concept.

FIG. 13 is a block diagram of an application example of an electronic system including a semiconductor device according to the inventive concept. Referring to FIG. 13, an electronic system 700 may include an input device 710, an output device 720, a processor device 730, and a semiconductor memory device 740. The semiconductor memory device 740 may include a memory device 750 which may include a memory controller (not shown) for driving the memory device 750. A data processing method according to an embodiment may be applied between data transmission/reception devices, and for example, a data transmission method using toggling of a CRC code may be applied between the processor device 730 and the semiconductor memory device 740. The processor device 730 controls the input device 710, the output device 720, and the semiconductor memory device 740 through corresponding interfaces.

Figure 14:
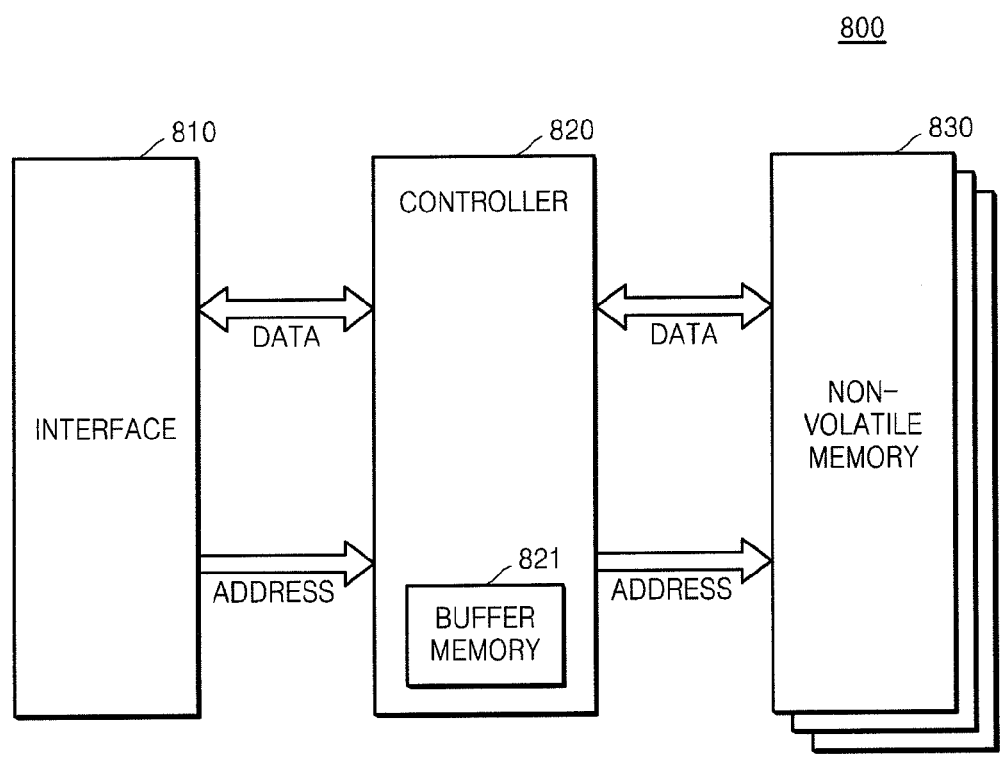
FIG. 14 is a block diagram of an application example of a memory card using a semiconductor device according to the inventive concept.

FIG. 14 is a block diagram of an application example of a memory card using a semiconductor device according to the inventive concept. Referring to FIG. 14, a memory card 800 may include an interface unit 810, a controller 820, and a semiconductor memory device 830. In FIG. 14, as the semiconductor memory device 830, a non-volatile memory device as well as the aforementioned DRAM, which is a volatile memory device, is applied.

The interface unit 810 provides interfacing between the memory card 800 and a host (not shown). The interface unit 810 may include a data exchange protocol corresponding to the host for interfacing with the host. The interface unit 810 may be configured to communicate with the host through one of various interface protocols such as a Universal Serial Bus (USB), a Multi-Media Card (MMC), a Peripheral Component Interconnect-Express (PCI-E), a Serial-attached SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

The controller 820 is provided with data and an address from an external source through the interface unit 810. The controller 820 accesses the semiconductor memory device 830 by referring to the data and the address provided from the host. The controller 820 may provide data read from the semiconductor memory device 830 to the host through the interface unit 810. The controller 820 may include a buffer memory 821.

The buffer memory 821 temporally stores write data provided from the host or the data read from the semiconductor memory device 830. If data existing in the semiconductor memory device 830 is cached upon a read request from the host, the buffer memory 821 supports a cache function of providing the cached data directly to the host. In general, a data transmission speed based on a bus format of the host (e.g., SATA or SAS) is higher than a transmission speed of a memory channel of the memory card 800. That is, when an interface speed of the host is higher than that of the memory card 800, performance degradation caused by a speed difference may be minimized by providing the buffer memory 821.

The semiconductor memory device 830 is provided as a storage medium of the memory card 800. For example, the semiconductor memory device 830 may be implemented as a resistive memory device. Alternatively, the semiconductor memory device 830 may be implemented as a NAND-type flash memory having large-capacity storage capability. The semiconductor memory device 830 may include a plurality of memory devices. In this case, each of the memory devices is connected to the controller 820 on a channel basis. The semiconductor memory device 830 as a storage medium may be a parameter random access memory (PRAM), a Magnetoresistive RAM (MRAM), a Resistance RAM (ReRAM), a Ferroelectric RAM (FRAM), a NOR flash memory, or the like, or may be a memory system in which heterogeneous memory devices are used. The data processing method according to an embodiment may be applied to the memory card 800, and for example, a data transmission method using toggling of a CRC code may be applied between the controller 820 and an external host (not shown). Alternatively, a data transmission method using toggling of a CRC code may be applied between the controller 820 and the semiconductor memory device 830 in the memory card 800.

Figure 15:
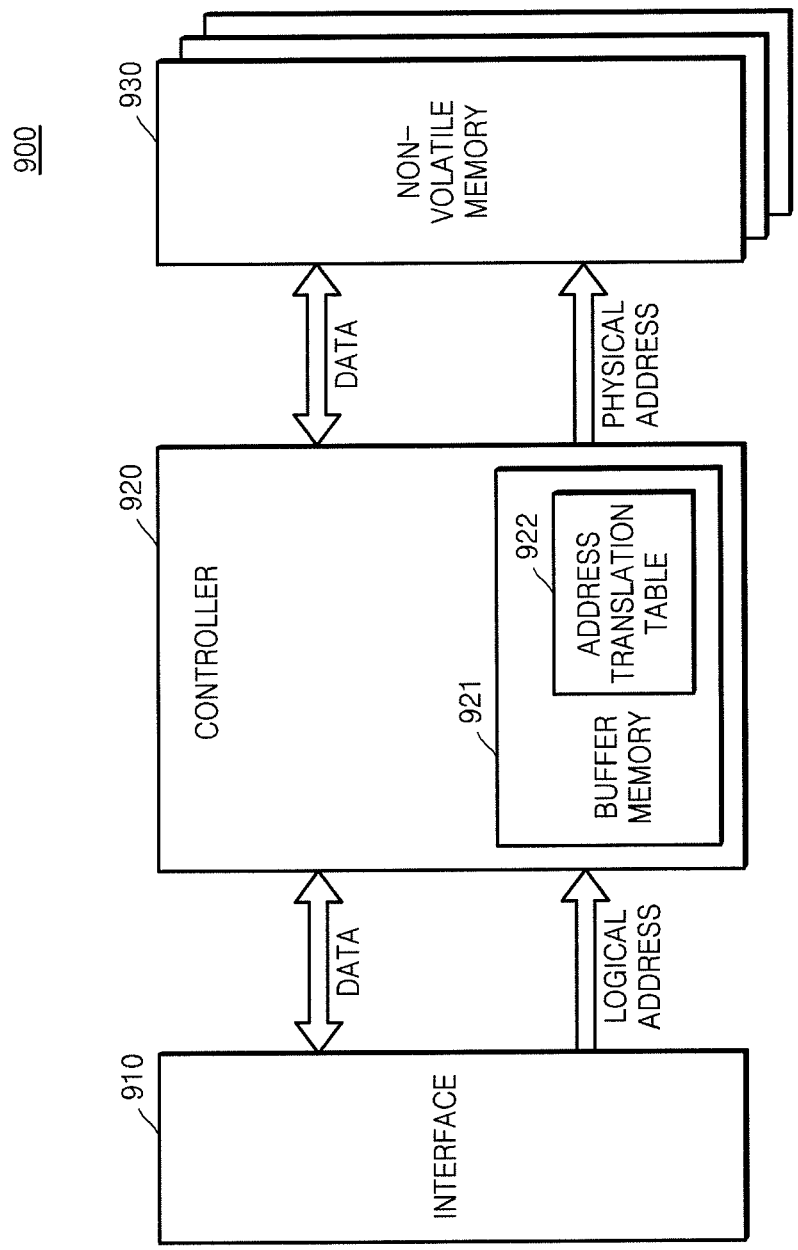
FIG. 15 is a block diagram of another application example of a memory card using a semiconductor device according to the inventive concept.

FIG. 15 is a block diagram of another application example of a memory card using a semiconductor device according to the inventive concept. Referring to FIG. 15, a memory card 900 may include an interface unit 910, a controller 920, and a semiconductor memory device 930. The structures of the interface unit 910 and the semiconductor memory device 930 are substantially the same as those of FIG. 14 and therefore, will not be described in detail.

A controller 920 may include a buffer memory 921 in which an address transformation table 922 is configured. The controller 920 transforms a logical address provided from the interface unit 910 into a physical address by referring to the address transformation table 922. The controller 920 may access the semiconductor memory device 930 by referring to the transformed physical address.

The memory card 800 shown in FIG. 14 and the memory card 900 shown in FIG. 15 may be mounted in an information processing device such as a digital camera, a portable media player (PMP), a mobile phone, a notebook computer, and so forth. The memory cards 800 and 900 may further use an MMC card, a secure digital (SD) card, a micro SD card, a memory stick, an ID card, a Personal Computer Memory Card International Association (PCMCIA) card, a chip card, a USB card, a smart card, a compact flash (CF) card, or the like.

Figure 16:
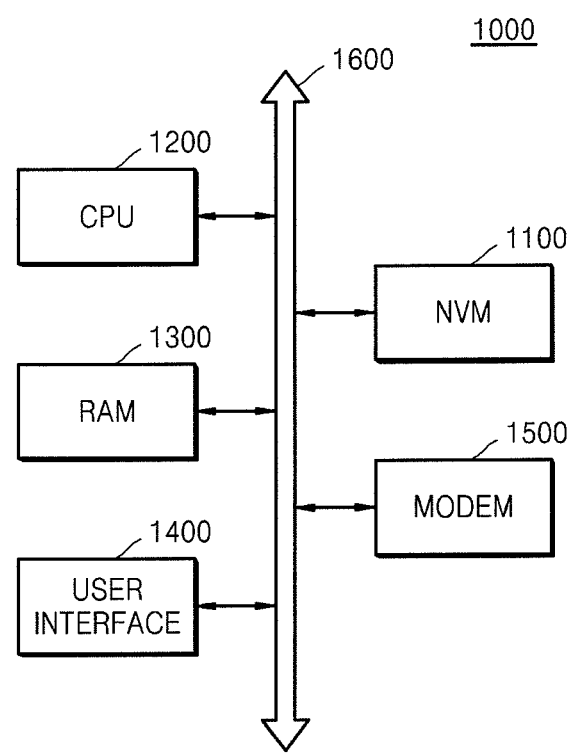
FIG. 16 is a block diagram of a computing system including a memory device or a memory system according to an embodiment of the inventive concept.

FIG. 16 is a block diagram of a computing system including a memory device or a memory system according to an embodiment of the inventive concept. A computing system 1000 according to an embodiment of the inventive concept may include a microprocessor 1200 electrically connected to a system bus 1600, a RAM 1300, a user interface 1400, a modem 1500 such as a baseband chipset, and a memory system 1100.

The memory system 1100 or the RAM 1300 stores or outputs data and may include various logic circuits for driving therein. When the computing system 1000 according to the inventive concept is a mobile device, a battery (not shown) for supplying an operating voltage of the computing system 1000 may be further provided. One ordinary skill in the art can readily appreciate that although not shown, an application chipset, a camera image processor (CIP), a mobile DRAM, etc., may further be provided in the computing system 1000 according to the inventive concept. The memory system 1100 may constitute, for example, a solid state drive/disk (SSD) which uses a non-volatile memory to store data. The memory system 1100 may be provided as a fusion flash memory (e.g., a memory in which an SRAM buffer, a NAND flash memory, and a NOR interface logic are combined).

The data processing method according to an embodiment of the inventive concept may be applied between data transmission/reception devices, and for example, a data transmission method using toggling of a CRC code may be applied to data communication between the memory system 1100 and the microprocessor 1200 and/or data communication between the memory system 1100 and the modem 1500. A data transmission method using toggling of a CRC code may be applied to data communication between a controller and a memory device (not shown) in the memory system 1100. A data transmission method using toggling of a CRC code may also be applied to data communication between the RAM 1300 and the microprocessor 1200 and/or data communication between the RAM 1300 and the modem 1500.

A semiconductor device and/or system according to the inventive concept may be mounted using a package in various forms. For example, a semiconductor device and/or system according to the inventive concept may be mounted using packages such as a Package on Package (PoP), Ball grid arrays (BGAs), Chip scale packages (CSPs), a Plastic Leaded Chip Carrier (PLCC), a Plastic Dual In-Line Package (PDIP), Die in Waffle Pack, Die in Wafer Form, a Chip On Board (COB), a Ceramic Dual In-Line Package (CERDIP), Plastic Metric Quad Flat Pack (MQFP), a Thin Quad Flatpack (TQFP), a Small Outline Integrated Circuit (SOIC), a Shrink Small Outline Package (SSOP), a Thin Small Outline Package (TSOP), a Thin Quad Flatpack (TQFP), a System In Package (SIP), a Multi Chip Package (MCP), a Wafer-level Fabricated Package (WFP), a Wafer-Level Processed Stack Package (WSP), and so forth.

While the inventive concept has been particularly shown and described with reference to exemplary embodiments thereof, they are provided for the purposes of illustration, and it will be understood by those of ordinary skill in the art that various modifications and equivalent other embodiments can be made from the inventive concept. Accordingly, the true technical scope of the inventive concept should be defined by the technical spirit of the appended claims.

What is claimed is:

1. A data processing device for transmitting a first data comprising:
   a data generator configured to provide the first data;
   a cyclic redundancy check (CRC) generator configured to generate a CRC information having at least one bit whose binary value is modified in response to a toggle information; and
   a data transmitter configured to combine the CRC information and the first data as a combined data and output the combined data in serial.

2. The data processing device of claim 1, wherein the toggle information determines the at least one bit in the CRC information to be determined.

3. The data processing device of claim 2, wherein the at least one bit is inverted in response to the toggle information.

4. The data processing device of claim 1 further comprising a pattern checker configured to generate the toggle information when the first data has a predetermined binary value pattern.

5. The data processing device of claim 4, wherein the predetermined binary value pattern has the same binary value.

6. The data processing device of claim 1 further comprising a register configured to store the toggle information.

7. The data processing device of claim 1, wherein the transmitter includes a parallel-to-serial converter configured to covert the combined data to a serial data.

8. The data processing device of claim 7, the serial data includes at least one low-to-high or high-to-low signal edge on the part of CRC information.

9. The data processing device of claim 1, wherein the data generator is a semiconductor memory device.

10. A data processing device for receiving a first data comprising:
    a data input buffer configured to receive a serial data having a CRC information and the first data;
    a clock recovery circuit configured to reconstruct a clock from the serial data;
    a sampling circuit configured to sample the serial data based on the clock;
    a converter circuit configured to parallelize and split the serial data into the CRC information and the first data;
    a CRC detector configured to modify the CRC information having at least one bit whose binary value is modified in response to a toggle information; and
    an error checker configured to determine whether the first data includes at least one error.

11. The data processing device of claim 10, wherein the toggle information determines the at least one bit in the CRC information to be modified.

12. The data processing device of claim 11, wherein the at least on bit whose binary value is inverted in response to the toggle information.

13. The data processing device of claim 12 further comprising a pattern checker configured to generate the toggle information when the first data has a predetermined binary value pattern.

14. The data processing device of claim 13, wherein the predetermined binary value pattern has the same value.

15. The data processing device of claim 13 further comprising a register configured to store the toggle information.

16. The data processing device of claim 10, wherein the serial data includes at least one low-to-high or high-to-low signal edge on the part of CRC information.

17. A data processing system for communicating a first data comprising:
    a first data processing semiconductor device for transmitting the first data comprising:
       data generator configured to provide a first data,
       a cyclic redundancy check (CRC) generator configured to generate a CRC information having at least one bit whose binary value is modified in response to a toggle information, and
       a data transmitter configured to combine the CRC information and the first data as a combined data and output the combined data in serial;
    a second data processing semiconductor device for receiving the first data comprising:
       a data input buffer configured to receive a serial data having a CRC information and a data,
       a clock recovery circuit configured to reconstruct a clock from the serial data,
       a sampling circuit configured to sample the data based on the clock,
       a converter circuit configured to parallelize the serial data and split the CRC information having at least one different binary value and the data, a CRC detector configured to modify the CRC information in response to a toggle information, and
an error checker configured to determine whether the data includes at least one error; and
a transmission line configured to transmit the combined data from the first data processing semiconductor device to the second data processing device.

\* \* \* \* \*